March 2, 1971 J. F. LAPHAM, JR 3,566,519

METHOD OF MAKING FIELD EFFECT TRANSISTOR DEVICE

Filed April 1, 1968

United States Patent Office 3,566,519

Patented Mar. 2, 1971

3,566,519

METHOD OF MAKING FIELD EFFECT TRANSISTOR DEVICE

Jerome F. Lapham, Jr., Williamstown, Mass., assignor to Sprague Electric Company, North Adams, Mass.

Filed Apr. 1, 1968, Ser. No. 717,493
Int. Cl. B01j *17/00;* H01g *13/00*
U.S. Cl. 29—571 7 Claims

ABSTRACT OF THE DISCLOSURE

A high purity coating of dielectric material is first formed over a major surface of a semiconductive body of one conductivity type. The coating is then purified by removal of a thin layer of its outer surface, and spaced apart regions of the other conductivity type are diffused within the body adjacent its major surface. The coating is again purified by removal of a thin outer layer, and the thickness of coating is reduced in an area overlying the channel formed by the separation between regions so as to provide a gate insulation of high purity without exposure of junctions.

In a further embodiment, an outer portion of the coating is modified with a passivating agent prior to the reduction in thickness of the coating in the channel area so that the modified portion of coating is removed from this area during the latter step but is retained in the remainder of the coating.

BACKGROUND OF THE INVENTION

This invention pertains to a method of making a field effect transistor device and more particularly to a method of making a highly passivated insulated gate field effect transistor device.

Insulated gate field effect transistors, hereinafter called MOS transistors, are generally constructed in the prior art by removing the masking oxide and regrowing a clean oxide layer which is to serve as the gate insulator. Hence in the prior art, the channel and its adjoining junctions are exposed to the ambient and are subject to the contamination from process chemicals and out-diffusion of the dopant or the like. Even in structures where the masking coating is removed only in the channel area, the junctions which remain under the masking coating are still subject to contamination from the impure overlying coating. Additionally, the removal of the masking coating in the prior art process makes it very difficult to further passivate the device by modifying the coating with a passivating agent.

It is an object of this invention to provide a method of making a fully passivated MOS transistor in which the channel or the junctions are not exposed after the forming thereof.

It is another object of this invention to provide a method of making an MOS transistor having an exceptionally pure dielectric coating.

It is a further object of this invention to provide a method of making an MOS transistor in which an original passivating coating of high purity is grown over the device and is maintained and further purified during the construction process.

It is still a further object of this invention to provide a method of making an MOS transistor having a substantially pure dielectric coating underlying the gate electrode and a coating modified by a passivating agent over the remainder of the device.

These and other objects of the invention will be apparent from the following description and claims taken in conjunction with the drawing.

SUMMARY OF THE INVENTION

Broadly, a method of making an MOS transistor in accordance with the invention includes the steps of forming a substantially pure coating of dielectric material overlying at least one major surface of a semiconductive body of one conductivity type, forming a pair of spaced apart regions of the other conductivity type within said body and adjacent said major surface for providing a channel therebetween, purifying said coating by removing a thin outer layer thereof, reducing the thickness of coating overlying said channel, depositing a conductive gate on said coating of reduced thickness and conductive contacts on said body in connection to each of said regions.

In a more limited sense, the spaced apart regions are formed beneath the purified coating by a two step diffusion of an impurity through openings of the coating with purification of the coating before the second or rediffusion step during which the dielectric coating is regrown in the opening, and the thickness of the regrown coating is made less than the coating to be removed from the gate area so as to allow reopening of the coating to the regions simultaneously with the reducing in thickness of the gate insulator.

In a still more limited embodiment, the coating is modified prior to said reducing step by addition of a passivating agent thereto in the outer surface thereof, and the depth of said modified coating being less than the thickness of coating to be removed during said reducing step.

DESCRIPTION OF THE PREFERRED EMBODIMENT

Figure 1:
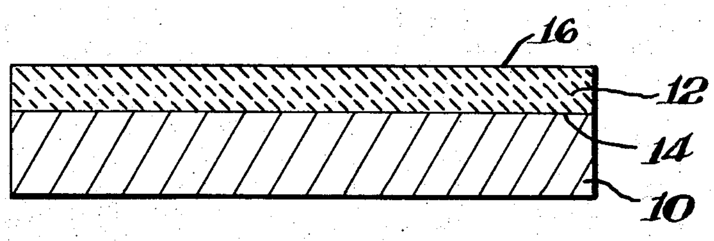
FIGS. 1–5 are sectional views of a semiconductive body illustrating successive steps in construction of a field effect transistor in accordance with one embodiment of the invention.

As shown in FIG. 1, a body 10 of semiconductive material such as silicon or the like is formed in any conventional manner. Body 10 is made to have a resistivity of 5 ohm-cm. and is of one conductivity type; for example N type. Thereafter a high purity dielectric coating 12 of silicon dioxide or the like is formed to a thickness of about 6000 angstroms over at least one major surface 14 of body 10. This is accomplished for example, by firing body 10 at about 1100° C. for approximately 20 hours in a quartz tube furnace and in a relatively pure oxygen atmosphere or the like.

Thereafter coating 12 is purified by removing a thin outer layer 16, for example by etching the surface for one minute with a 10% solution of hydrofluoric acid or the like. This removes a surface layer of about 300 angstroms thickness in which charges and impurities of the oxide, such as alkali metals and the like, tend to collect.

Alkali metals, which are a common inorganic impurity of silicon dioxide, tend to produce charges at the silicon-oxide interface and cause instability, however, these impurities migrate to the surface and can be removed. This concentration of impurities is accelerated at elevated temperatures. Hence, removal of an outer surface layer after each heating step is particularly useful.

Figure 2:
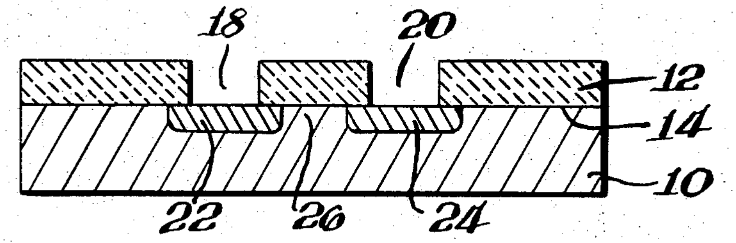

Suitable openings 18 and 20, as shown in FIG. 2, are then formed in coating 12 to provide access to surface 14, and regions 22 and 24 of high conductivity and the other conductivity type are then formed by conventional means within body 10 adjacent this surface. Regions 22 and 24 are spaced apart in body 10 to provide source and drain regions of the device and a channel region 26 in the separation between them.

In this example, regions 22 and 24 are formed of suitably high P-type conductivity for example having a surface concentration of about $10^{19}$ atoms/cm.$^3$ by diffusion or the like. For example, impurities such as boron or the like are deposited on surface 14 within openings 18 and 20 and the unit is fired for ¾ of an hour in a clean furnace at a temperature of approximately 1100° C.

After the first diffusion step, the coating is again purified by removing a thin outer layer. This not only eliminates new impurities drawn from the environment but also further purifies the original coating since additional migration of impurities towards the surface takes place during the prior heating step.

Figure 3:
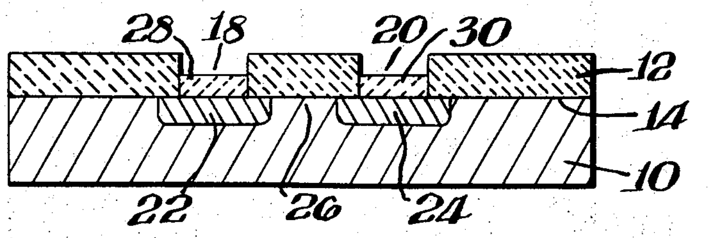

The unit is then reheated at 1100° C. for 11 hours to redistribute the impurities and to grow oxide coatings 28 and 30 to a thickness of about 2500 angstroms within openings 18 and 20 as shown in FIG. 3. Thereafter the coating is again purified by removal of a thin top layer by etching or the like. It should be noted that each heating step is carried out in a clean furnace and a high purity atmosphere so as to avoid contamination of the coating during construction of the unit.

Figure 4:
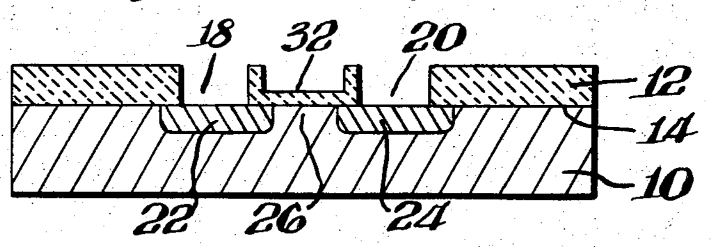

In a next step, as shown in FIG. 4, a portion of the oxide overlying channel 26 is cut back to provide a gate insulator 32 of proper thickness. Approximately 4500 angstroms of coating is removed by etching or the like to provide a typical dielectric thickness of 1000 to 2000 angstroms in the gate area. This may be accomplished by conventional photoresist masking and then etching with hydrofluoric acid or for example with ammonium fluoride buffered HF solution for about 3 minutes. Preferably, openings 18 and 20 are reopened during this step to permit connection to these regions. This simultaneous etch back of the gate and opening of the coating is possible since the thickness of oxide removed in the gate area is greater than the thickness of regrown oxide. Thereafter the coating is again purified by removal of a thin outer layer. Finally, metal such as aluminum or the like is deposited over the surface, and then selectively removed by etching or the like to provide source and drain contacts 34 and 36 and gate 38.

Hence, this process provides a gate insulator of exceptional purity without at any time exposing junctions of the unit to the environment. The gate insulator 32 is a portion of the original coating 12, however, it will have less impurities than the original coating due to the repetitive removal of its outer surface during the construction process. It should be understood of course that although it is advantageous, removal of the impurity laden outer layer of coating is not necessary after each and every step of the process but should at least be employed after heat treatment such as the diffusion step.

Figure 6:
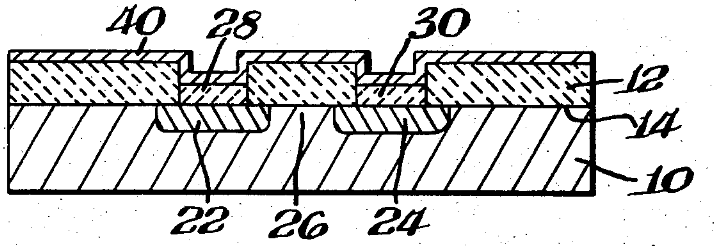
FIGS. 6 and 7 are sectional views illustrating additional steps in construction of a field effect transistor in accordance with another embodiment of the invention.

Advantageously, this process also permits construction of a unit having a substantial portion of the coating further passivated by modifying or doping its outer surface with a passivating agent such as phosphorous glass or the like. This may be accomplished, as shown in FIG. 6, by depositing a layer 40 of phosphorous glass ($P_2O_5$) or the like over oxide coating 12 after the purification step which followed redistribution of the impurity regions. That is, after completion of diffusion and the subsequent purification of the oxide, a layer 40 of phosphorous glass is formed over the full surface by gas phase deposit or the like.

Figure 5:
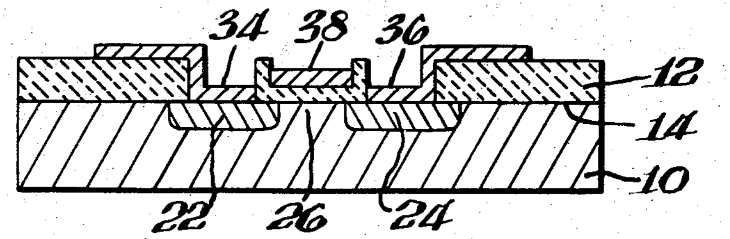
Figure 7:
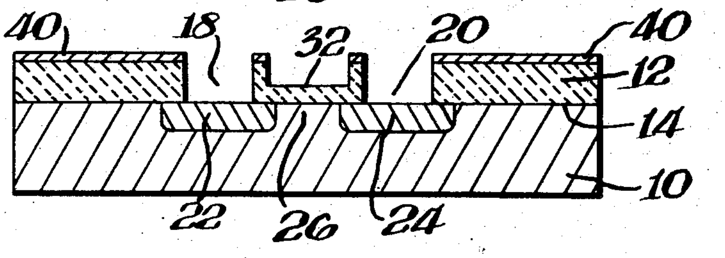

Then, as shown in FIG. 7, the gate insulator is cut back and the source and drain opened as previously described. However, in this case, the reduction of oxide in the gate area must take into account the composition and thickness of coating. Hence, the coating is removed to a depth exceeding the $P_2O_5$ layer and modified portions of the original coating 12. Finally, the device is then completed by the addition of source and drain contacts and a gate electrode similar to that of FIG. 5.

It should be noted that cut back of the gate is illustrated as confined to an area which overlays channel 26 and adjoining junctions so that a portion of the original thickness of coating remains on either side of the gate depression and provides insulation between the different contacts. However it should be understood that the area of reduced thickness could extend from opening 18 to opening 20.

Although the present invention has been described in terms of an N-type body and P-type regions, it should be understood that the device could also be fabricated with a P-type body and N-type regions. In addition, materials other than silicon and silicon dioxide could be useful. Hence, it should be understood that many different modifications of the invention may be made without departing from the spirit and scope thereof and that the invention is not to be limited except as defined in the appended claims.

What is claimed is:

1. A method of making an insulated gate field effect transistor comprising the steps of forming a semiconductive body of low conductivity and one conductivity type, forming a substantially pure coating of dielectric material overlying a major surface of said body, forming a pair of spaced apart regions of the other conductivity type within said body adjacent said major surface for providing a channel therebetween, wherein said regions are formed at temperatures sufficiently high to cause a substantial migration and concentration of impurities at the outer surface of said coating, purifying said coating by removing a thin outer layer from the entire surface thereof, so as to remove those impurities which have been collected therein, substantially reducing the thickness of said coating in an area overlying said channel, and depositing a conductive gate on said coating of reduced thickness.

2. The method of claim 1 including a purification step before forming of said regions wherein said coating is heated to a temperature sufficiently high to cause a substantial migration and concentration of impurities at the outer surface thereof, and wherein a thin outer layer is removed from the entire surface together with the impurities which have been collected therein.

3. The method of claim 1 including modifying a surface layer of said coating after said purification step with a passifying agent to a depth less than the thickness of coating to be removed in said reducing step.

4. The method of claim 3 wherein said passifying agent is phosphorous which is provided by an overlying deposit of phosphorous glass.

5. The method of claim 1 wherein said regions are formed by diffusion at temperatures sufficient to cause a substantial migration and concentration of impurities at the outer surface of said coating, followed by a redistribution step, and said purification step of removing a thin outer layer together with the impurities which have been collected therein is accomplished after said diffusion and before said redistribution step.

6. The method of claim 5 including forming of spaced apart openings in said coating for diffusion of said regions and reforming of dielectric coating in said openings during said redistribution step to a thickness less than the thickness of coating to be removed during said reducing step, and simultaneously removing said regrown coating during said reducing step for providing exposure of the surface of said regions.

7. The method of claim 6 including a purification step prior to said diffusion step and after said reducing step wherein said coating is heated to a temperature sufficiently high to cause a substantial migration and concentration of impurities at the outer surface thereof, and wherein a thin outer layer is removed from the entire surface together with the impurities which have been collected therein.

References Cited

UNITED STATES PATENTS

| | | | |
|---|---|---|---|
| 3,085,033 | 4/1963 | Handelman | 148—33.1X |
| 3,183,128 | 5/1965 | Leistiko et al. | 148—187X |
| 3,226,611 | 12/1965 | Haenichen | 29—571UX |
| 3,463,974 | 8/1969 | Kelley et al. | 29—571UX |

JOHN F. CAMPBELL, Primary Examiner

W. TUPMAN, Assistant Examiner

U.S. Cl. X.R.

29—578; 148—187, 191; 317—234